(12) United States Patent
Chen et al.

(10) Patent No.: US 6,872,619 B2
(45) Date of Patent: Mar. 29, 2005

(54) SEMICONDUCTOR DEVICE HAVING TRENCH TOP ISOLATION LAYER AND METHOD FOR FORMING THE SAME

(75) Inventors: Yi-Nan Chen, Taipei (TW); Tieh-Chiang Wu, Ilan (TW); Feng-Chuan Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/620,869

(22) Filed: Jul. 16, 2003

(65) Prior Publication Data

US 2004/0209422 A1 Oct. 21, 2004

(30) Foreign Application Priority Data

Apr. 15, 2003 (TW) ......................... 92108626 A

(51) Int. Cl.⁷ .................. H01L 21/8242; H01L 27/108
(52) U.S. Cl. ................ 438/242; 438/243; 257/302; 257/300
(58) Field of Search ................. 438/242, 258, 438/253, 338, 386, 270; 257/300, 301, 302, 296, 330, 315, 530

(56) References Cited

U.S. PATENT DOCUMENTS 6,255,683 B1 * 7/2001 Radens et al. .............. 257/301
6,501,117 B1 * 12/2002 Radens et al. .............. 257/301
6,596,592 B2 * 7/2003 Bertin et al. ................ 438/270
6,707,095 B1 * 3/2004 Chidambarrao et al. ..... 257/302

FOREIGN PATENT DOCUMENTS

| TW | 459385 | 10/2001 |
|---|---|---|
| TW | 463286 | 11/2001 |
| TW | 463295 | 11/2001 |

* cited by examiner

*Primary Examiner*—Long Pham
*Assistant Examiner*—Vikki Hoa B. Trinh
(74) *Attorney, Agent, or Firm*—Quintero Law Office

(57) ABSTRACT

A method for forming a semiconductor device having a trench top isolation layer. A collar insulating layer is formed over a lower portion of the sidewall of the trench formed in a substrate. A first conductive layer is formed in the lower portion of the trench and protrudes the collar insulating layer, and a second conductive layer is formed overlying the first conductive layer and covers the collar insulating layer. An insulating spacer is formed over an upper portion of the sidewall of the trench and separated from the second conductive layer by a gap. The second conductive layer is partially thermally oxidized to form an oxide layer thereon whereby the gap is filled. After the oxide layer is removed, a reverse T-shaped insulating layer is formed thereon by chemical vapor deposition to serve as a trench top isolation layer. Finally, the insulating spacer is removed.

15 Claims, 5 Drawing Sheets

SEMICONDUCTOR DEVICE HAVING TRENCH TOP ISOLATION LAYER AND METHOD FOR FORMING THE SAME

BACKGROUND OF THE INVENTION

1. Field of the Invention

The present invention relates in general to a method for forming a trench top isolation layer. More particularly, it relates to a semiconductor device having a trench top oxide (TTO) and the method for forming the same.

2. Description of the Related Art

Semiconductor devices are used in a variety of electronic applications, such as personal computers and cellular phones. In order to increase integrity of integrated circuits, the semiconductor industry in general is being driven to decrease the size of the semiconductor devices located on integrated circuits.

Semiconductor memory devices are one of the semiconductor products widely applied in electronic systems for storing data, and one common type of semiconductor memory is dynamic random access memory (DRAM). Typically, a DRAM cell includes an access field effect transistor (FET) and a storage capacitor. The access FET allows the transfer of data charges to and from the storage capacitor during reading and writing operations.

In order to decrease the size of the semiconductor memory devices, a vertical access transistor technology is developed. In such a technology, the storage capacitor is formed in the lower portion of the trench, and the access transistor is formed in the upper portion of the trench. In addition, a thick dielectric layer called trench top oxide (TTO) is formed between the capacitor and the transistor for electrical isolation therebetween.

FIG. 1 is a cross-section showing a conventional semiconductor device having a trench top isolation layer. The semiconductor device includes a substrate 100, such as a silicon substrate, having a deep trench 103 formed by etching the substrate 100 using a masking layer 105 as a hard mask. The masking layer 105 includes a pad oxide layer 102 and an overlying nitride layer 104. A trench capacitor (not shown) is disposed in the lower portion of the trench 103. A collar insulating layer 106, such as silicon oxide, is disposed overlying the trench capacitor and over the sidewall of the lower portion of the trench 103.

A conductive layer 108, such as a polysilicon layer, is disposed overlying the trench capacitor and protrudes the collar insulating layer 106. Another conductive layer 112, such as a polysilicon layer, is disposed on the conductive layer 108 and covers the collar insulating layer 106.

A buried strap 110 is formed in the substrate 100 near the upper portion of the collar insulating layer 106 to serve as a drain region for the subsequent vertical transistor. The drain region electrically connects with the trench capacitor through the conductive layers 108 and 112. In general, the buried strap 110 is formed by diffusing the dopant in a doped dielectric layer (not shown) into the substrate 100 by a drive-in process.

A TTO layer 114, such as tetraethyl orthosilicate (TEOS) oxide, is disposed on the conductive layer 112 for electrical isolation between the trench capacitor and the subsequent vertical transistor. Typically, the formation of the TTO layer 114 includes the following steps. First, a conformable silicon oxide layer is formed on the masking layer 105 and the inner surface of the trench 103 (overlying the conductive layer 112) by high-density plasma chemical vapor deposition (HDPCVD), wherein the bottom of the silicon oxide layer in the trench 103 is thicker than that over the sidewall of the trench 103. Thereafter, the silicon oxide layer on the masking layer 105 is removed by polishing and then that over the sidewall of the trench 103 is removed by wet chemical etching to leave the bottom portion of the silicon oxide layer in the trench 103. After wet chemical etching, however, the remaining silicon oxide layer serving as a TTO layer is dished at its middle portion, as shown in the FIG. 1, causing poor edge uniformity. The non-uniform TTO layer 114 degrades the insulating property and reduces reliability of the semiconductor device.

SUMMARY OF THE INVENTION

Accordingly, an object of the present invention is to provide a novel method for forming a semiconductor device having a trench top isolation layer, which employs a two step deposition method such as thermal oxidation and chemical vapor deposition instead of conventional single step deposition to form the trench top isolation layer, thereby precisely controlling its thickness.

Another object of the present invention is to provide a semiconductor device having a trench top isolation layer, which uses a reverse T-shaped trench top oxide layer to increase its edge uniformity, thereby preventing poor insulation due to the dishing effect of the trench top isolation layer.

According to the object of the invention, a method for forming a semiconductor device having a trench top isolation layer is provided. First, a collar insulating layer is formed over a lower portion of the sidewall of the trench formed in a substrate. Next, a first conductive layer is formed in the lower portion of the trench and protrudes the collar insulating layer. Thereafter, a second conductive layer is formed overlying the first conductive layer and covers the collar insulating layer. Next, an insulating spacer is formed over an upper portion of the sidewall of the trench and separated from the second conductive layer by a gap. Next, the second conductive layer is partially thermally oxidized to form an oxide layer thereon whereby the gap is filled. After the oxide layer is removed, a reverse T-shaped insulating layer is formed thereon by chemical vapor deposition to serve as a trench top isolation layer. Finally, the insulating spacer is removed.

The collar insulating layer can be a silicon oxide layer. The first conductive layer can be a polysilicon layer and the second conductive layer can be a doped polysilicon layer.

Moreover, the reverse T-shaped trench top insulating layer can be a tetraethyl orthosilicate (TEOS) oxide and formed by low pressure CVD (LPCVD).

Another aspect of the invention is a semiconductor device having a trench top isolation layer. The device includes a substrate, a first conductive layer a second conductive layer, and a reverse T-shaped insulating layer. The substrate has at least one trench and a collar insulating layer is disposed over a lower portion of the sidewall of the trench. The first conductive layer is disposed in the lower portion of the trench and protrudes the collar insulating layer. The second conductive layer is disposed overlying the first conductive layer and covers the collar insulating layer. The reverse T-shaped insulating layer is disposed overlying the second conductive layer to serve as a trench top isolation layer. A gate is disposed overlying the reverse T-shaped insulating layer and insulated from the substrate.

The collar insulating layer can be a silicon oxide layer. The first conductive layer can be a polysilicon layer and the second conductive layer can be a doped polysilicon layer.

Moreover, the reverse T-shaped trench top insulating layer can be a tetraethyl orthosilicate (TEOS) oxide and formed by low pressure CVD (LPCVD).

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
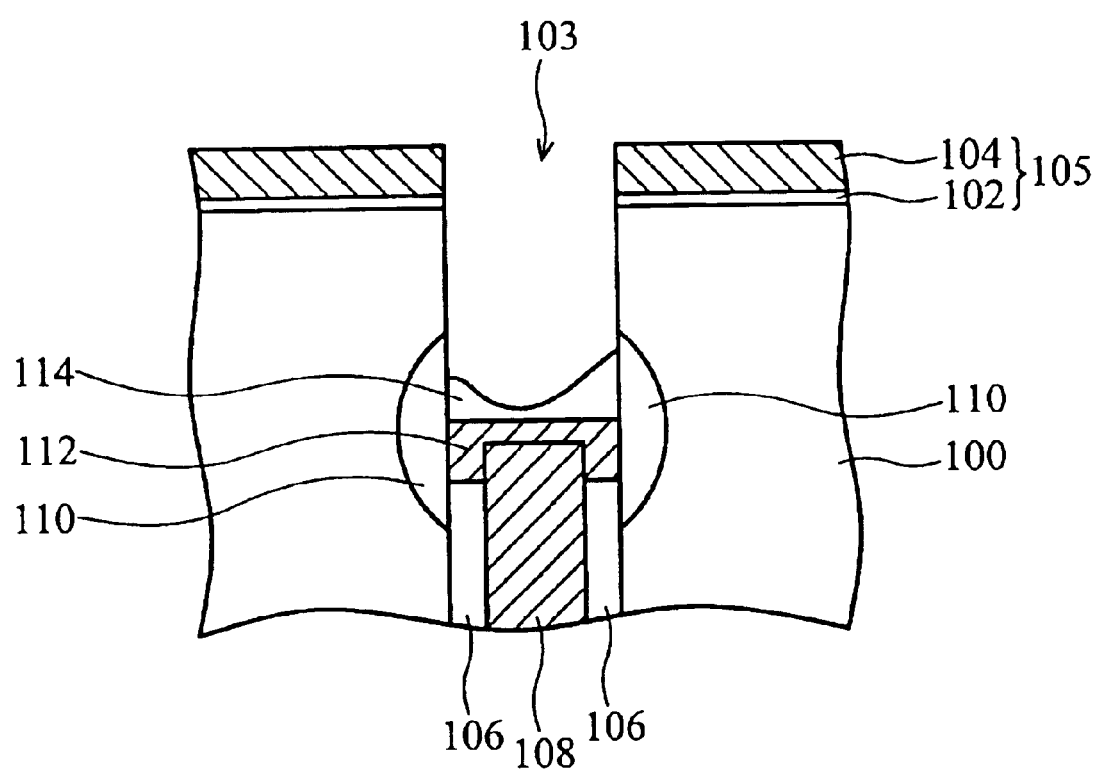
FIG. 1 is a cross-section showing a conventional semiconductor device having a trench top isolation layer.
Figure 2A:
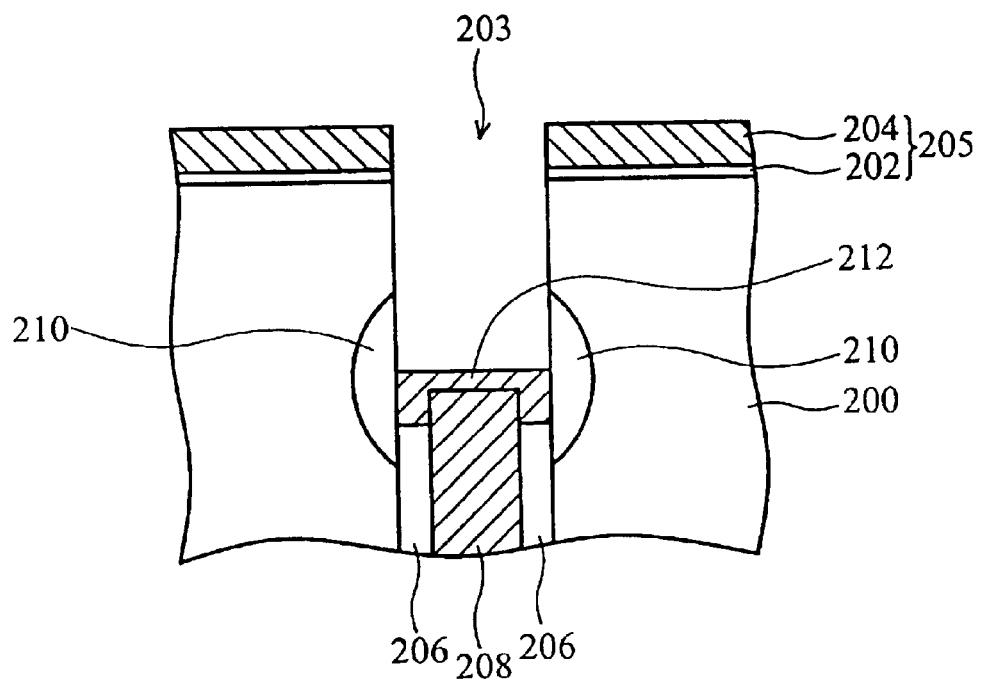
FIGS. 2a to 2g are cross-sections showing a method for forming a semiconductor device having a trench top isolation layer according to the invention.

In FIG. 2a, a substrate 200, such as a silicon substrate, is provided. A mask layer 205 is formed on the substrate 200. The mask layer 205 can be composed of a pad oxide layer 202 and a thicker overlying silicon nitride layer 204. In this invention, the pad oxide layer 202 can be formed by thermal oxidation or conventional CVD, which has a thickness of about 100 Å. Moreover, the silicon nitride layer 204 overlying the pad oxide layer 202 can be formed by LPCVD using $SiCl_2H_2$ and $NH_3$ as reaction sources. Next, a plurality of openings is formed in the masking layer 205 by lithography and etching. Thereafter, anisotropic etching, such as reactive ion etching (RIE), is performed on the substrate 200 using the masking layer 205 as an etch mask to form a plurality of trenches therein. In order to simplify the diagram, only one trench 203 is shown.

Next, a trench capacitor (not shown) is formed in the bottom of the trench 203. The trench capacitor includes a buried plate (BP), a capacitor dielectric layer, and a top plate. The buried plate is a doping region formed in the substrate 200 near the bottom of the trench 203. The capacitor dielectric layer can be a silicon oxide/silicon nitride (ON) layer or a silicon oxide/silicon nitride/silicon oxide (ONO) layer. The top plate can be a polysilicon layer.

Next, a collar insulating layer 206, such as silicon oxide, is formed over a lower portion of the sidewall of the trench 203 and overlying the trench capacitor. Thereafter, a doping region 210 is formed in the substrate 200 near the upper portion of the collar insulating layer 206 to serve as a drain region for the subsequent vertical transistor. In the invention, the doping region 210 is formed in the substrate 200 by diffusing the dopant in a doped dielectric layer (not shown) into the substrate 200 by a drive-in process.

Next, a first conductive layer 208, such as a polysilicon or doped polysilicon layer, is formed in the lower portion of the trench 203 (overlying the trench capacitor) and protrudes the collar insulating layer 206. Thereafter, a second conductive layer 212, such as a doped polysilicon layer, is formed overlying the first conductive layer 208 and covers the collar insulating layer 206 to form a substantially flat surface. Here, the trench capacitor electrically connects with the doping region 210 through the first and second conductive layers 208 and 212.

Figure 2B:
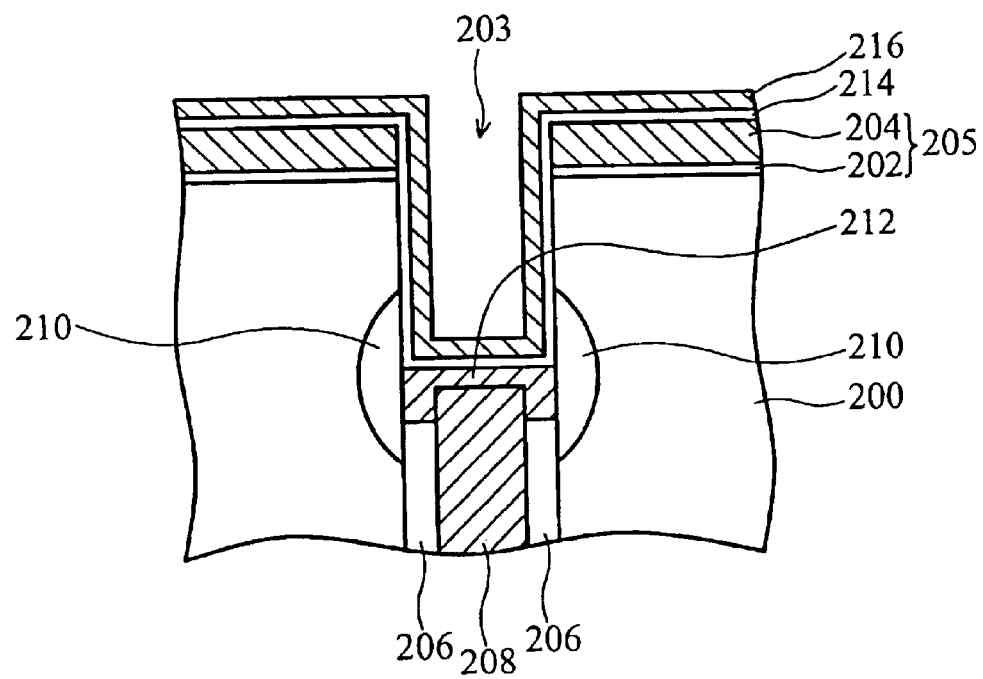

Next, in FIG. 2b, a pad oxide layer 214 and a silicon nitride layer 216 are successively and conformably formed on the masking layer 205 and the inner surface of the trench 203. In the invention, the pad oxide layer 214 can be a tetraethyl orthosilicate (TEOS) oxide layer formed by chemical vapor deposition (CVD), which has a thickness of about 50~60 Å. Also, the silicon nitride layer 216 can be formed by CVD, which has a thickness of about 150~240 Å.

Figure 2C:
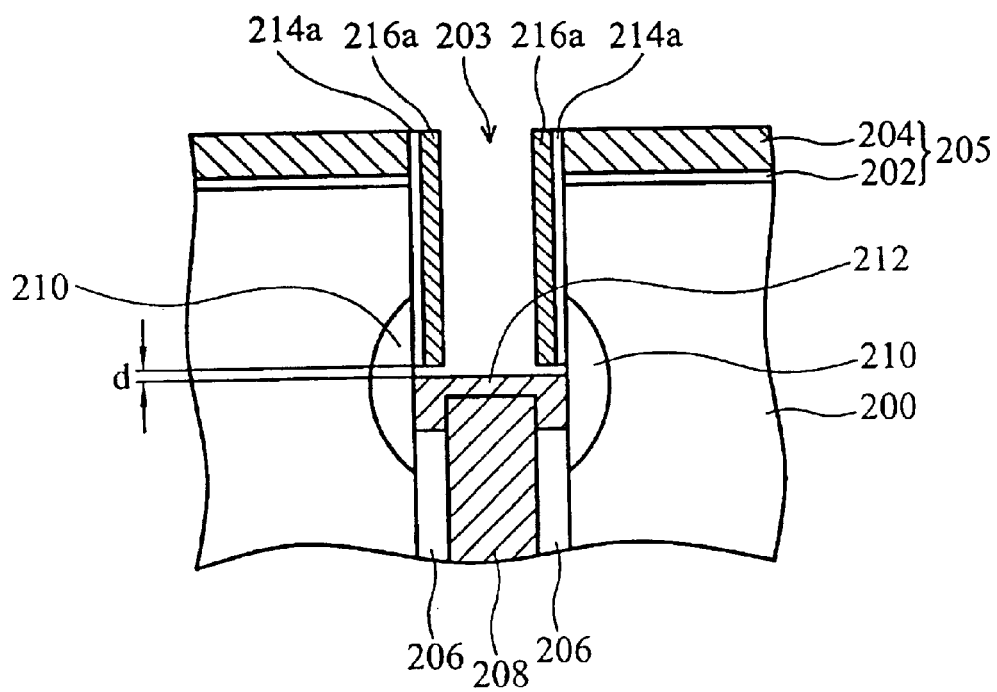

Next, in FIG. 2c, the silicon nitride layer 216 and the pad oxide layer 214 on the masking layer 205 and on the second conductive layer 212 in the trench 203 are removed by anisotropic etching, such as RIE, to form insulating spacers 214a and 216a over an upper portion of the sidewall of the trench 203, which has a thickness of about 200~300 Å. Subsequently, the bottom of the insulating spacer 214a is removed by hydrofluoric (HF) acid or other suitable solution using the insulating spacer 216a as an etch mask to form a gap having a width d of about 50~60 Å between the insulating spacers 214a and 216a and the second conductive layer 212.

Figure 2D:
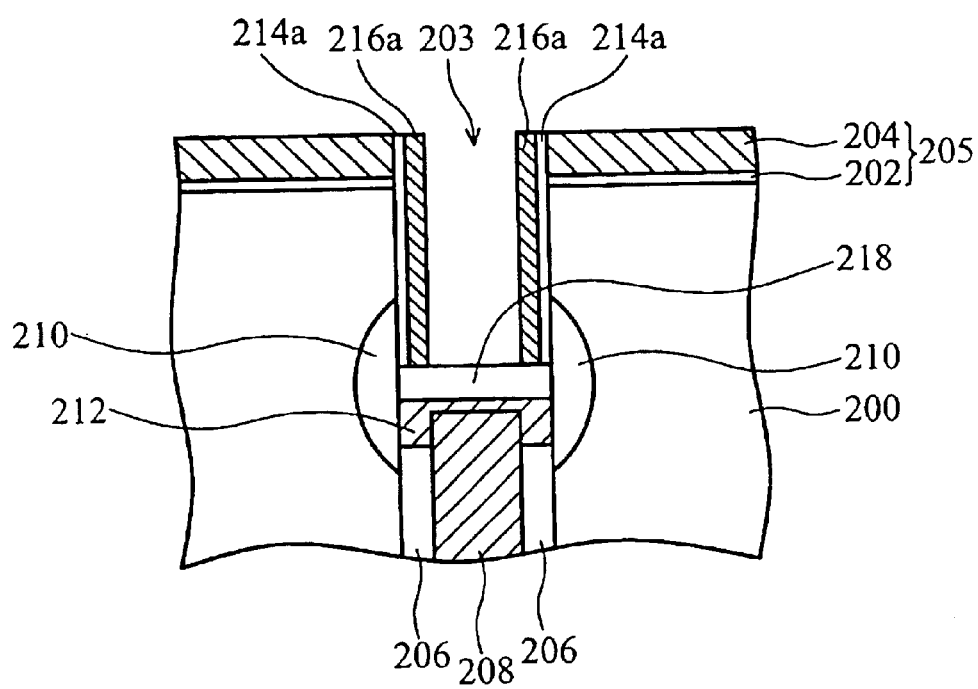

Next, in FIG. 2d, thermal oxidation is performed to oxidize a portion of the second conductive layer 212 to form a doped silicon oxide layer 218 thereon whereby the gap is filled. Here, since the insulating spacer 216a composed of silicon nitride suppresses oxygen reacting with the doped polysilicon layer 212, the doped silicon oxide layer 218 stops growing when the gap is fully filled with the oxide layer 218. The doped silicon oxide layer 218 formed by thermal oxidation have good uniformity.

Figure 2E:
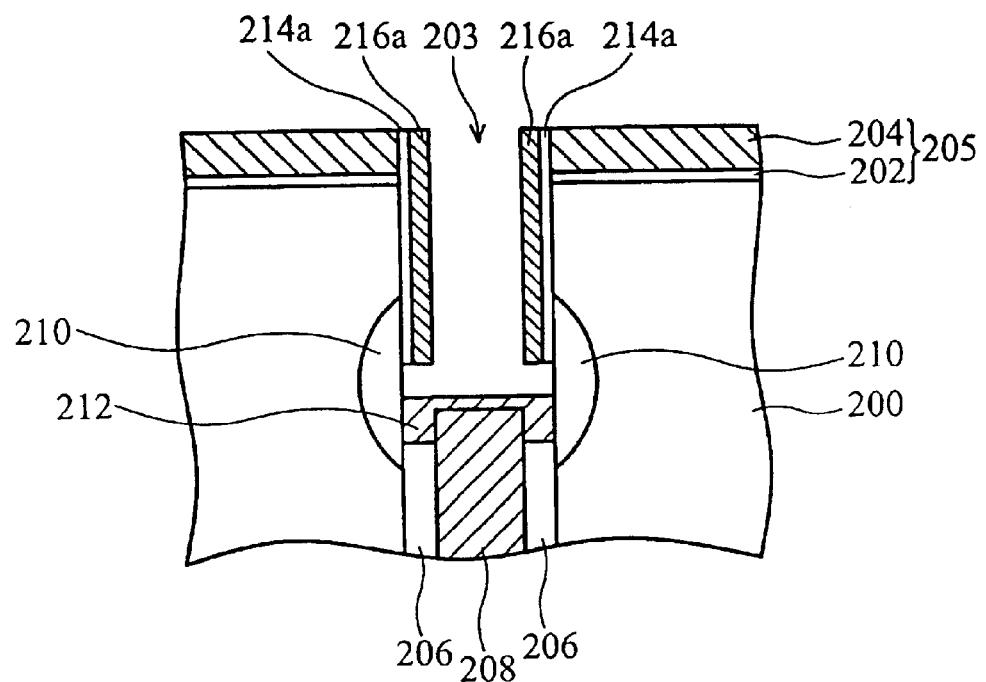

Next, in FIG. 2e, since the doped silicon oxide layer 218 has a poor insulating property, it is not sufficient to serve as a trench top isolation layer. Accordingly, in the invention, the doped silicon oxide layer 218. is removed by HF to expose the second conductive layer 212 and leave a space with better edge uniformity for forming a trench top isolation layer in the subsequent process. Moreover, the thickness of the trench top isolation layer can be precisely controlled through the space.

Figure 2F:
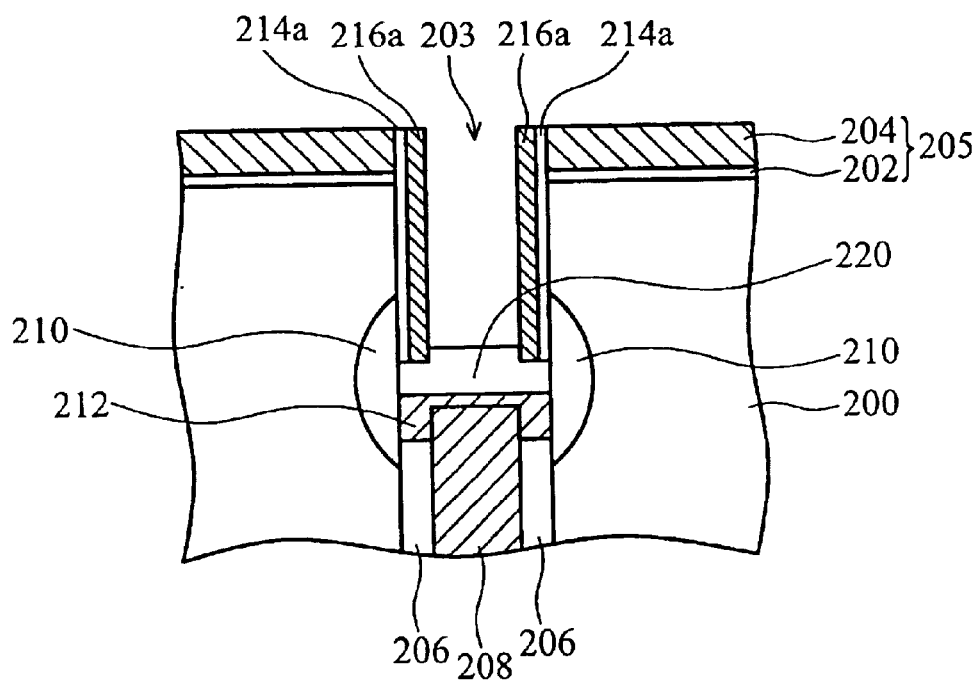

Next, in FIG. 2f, the space is filled with an insulating layer 220 formed by CVD to serve as a trench top isolation layer. In the invention, the insulating layer 220 is formed overlying the second conductive layer 212 by low pressure CVD (LPCVD) using tetraethyl orthosilicate (TEOS) as a reaction source to fill and protrude from the space, so as to form a reverse T-shaped trench top oxide (TTO) layer 220.

Figure 2G:
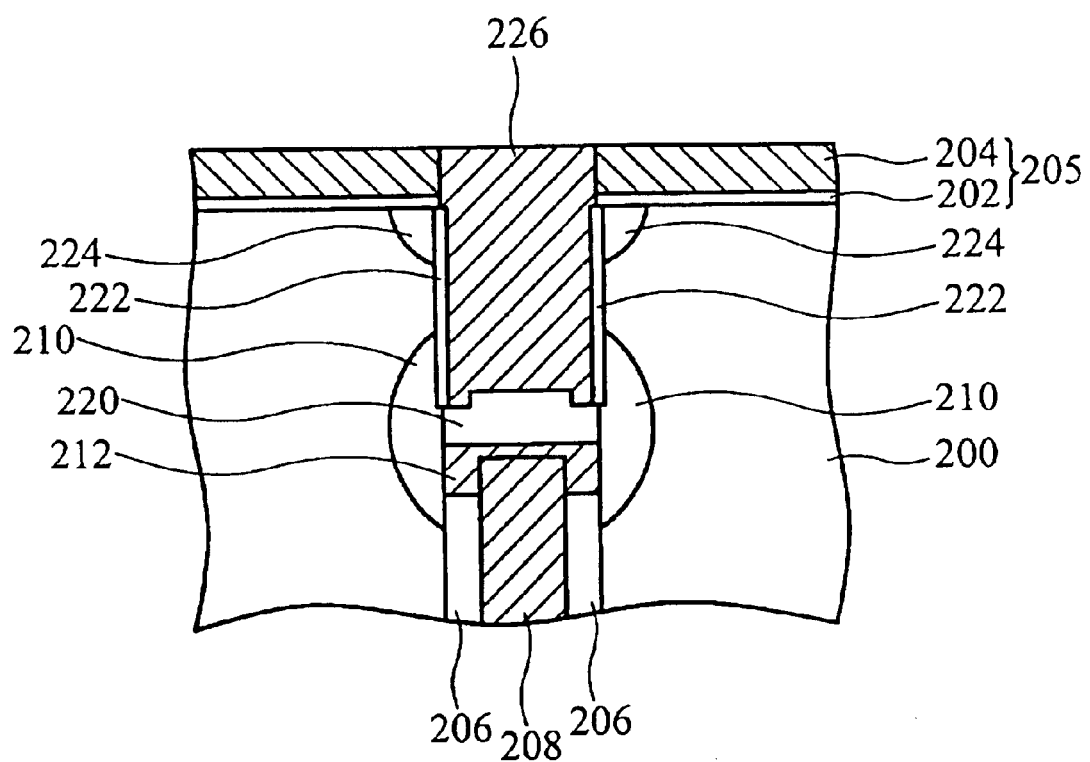

Finally, in FIG. 2g, the insulating spacers 216a and 214a are removed to expose the sidewall of the upper portion of the trench 203. Next, a vertical transistor is formed overlying the trench top isolation layer 220 by conventional method.

Still in FIG. 2g, a cross-section of a semiconductor device having a trench top isolation layer according to the invention is shown. In the invention, the semiconductor device can be a dynamic random access memory (DRAM) which includes a substrate 200, a first conductive layer 208, a second conductive layer 212, a reverse T-shaped insulating layer 220, and a vertical transistor. The substrate 200 has at least one trench 203, and a collar insulating layer 206, such as silicon oxide, is disposed over the sidewall of the lower portion of the trench 203.

The first conductive layer 208, such as polysilicon, is disposed in the lower portion of the trench 203 and protrudes the collar insulating layer 206. The second conductive layer 212, such as doped polysilicon, is disposed overlying the first conductive layer 208 and covers the collar insulating layer 206. Moreover, the reverse T-shaped insulating layer 220, such as TEOS oxide, is disposed overlying the second conductive layer 212 to serve as a trench top oxide layer.

The vertical transistor is disposed overlying the reverse T-shaped insulating layer 220, which includes a gate 226, a gate dielectric layer 224, a drain region 210, and a source region 224. The source region 224 is formed in the substrate 200 near the upper portion of the trench 203 by ion implantation, and the drain region is formed in the substrate 200 near the upper portion of the collar insulating layer 206 by diffusing the dopant in a doped dielectric layer (not shown) into the substrate 200 by a drive-in process. The gate dielectric layer 222 can be a silicon oxide layer formed by thermal oxidation. The gate 226 can be a doped polysilicon layer which is insulated from the substrate 200 by the gate dielectric layer 222.

Compared to the prior art, the trench top isolation layer of the invention is formed by LPCVD, but not high-density plasma CVD (HDPCVD). Accordingly, the trench top isolation layer can be formed without dishing. Moreover, the reverse T-shaped trench top isolation layer of the invention is formed by a two step deposition such as thermal oxidation and LPCVD. Accordingly, excellent edge uniformity of the trench top isolation layer can be achieved, thereby increasing its insulating property and improving device reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadset interpretation so as to encompass all such modifications and similar arrangements.

What is claimed is:

1. A method for forming a semiconductor device having a trench top isolation layer, comprising the steps of:
   providing a substrate having at least one trench therein;
   forming a collar insulating layer over the sidewall of a lower portion of the trench;
   forming a first conductive layer protruding to the collar insulating layer in the lower portion of the trench;
   forming a second conductive layer overlying the first conductive layer and covering the collar insulating layer;
   forming an insulating spacer over an upper portion of the sidewall of the trench and separated from the second conductive layer by a gap;
   thermally oxidizing a portion of the second conductive layer to form an oxide layer thereon whereby the gap is filled;
   removing the oxide layer to expose the second conductive layer;
   forming a reverse T-shaped insulating layer by chemical vapor deposition to serve as the trench top isolation layer; and
   removing the insulating spacer.

2. The method as claimed in claim 1, further forming a gate insulated from the substrate and overlying the reverse T-shaped insulating layer.

3. The method as claimed in claim 1, wherein the collar insulating layer is a silicon oxide layer.

4. The method as claimed in claim 1, wherein the first conductive layer is a polysilicon layer.

5. The method as claimed in claim 1, wherein the second conductive layer is a doped polysilicon layer.

6. The method as claimed in claim 1, wherein the insulating spacer is composed of a pad oxide layer and an overlying silicon nitride layer.

7. The method as claimed in claim 6, wherein the insulating spacer has a thickness of about 200–300 Å.

8. The method as claimed in claim 1, wherein the gap has a width of about 50–60 Å.

9. The method as claimed in claim 1, wherein the reverse T-shaped insulating layer is formed by low pressure chemical vapor deposition (LPCVD).

10. The method as claimed in claim 1, wherein the reverse T-shaped insulating layer is a tetraethyl orthosilicate (TEOS) oxide.

11. A semiconductor device having a trench top isolation layer, comprising:
    a substrate having at least one trench formed therein;
    a collar insulating layer disposed over a lower portion of the sidewall of the trench;
    a first conductive layer disposed in the lower portion of the trench and protruding the collar insulating layer;
    a second conductive layer disposed overlying the first conductive layer and covering the collar insulating layer;
    a reverse T-shaped insulating layer disposed overlying the second conductive layer to serve as the trench top isolation layer; and
    a gate disposed overlying the reverse T-shaped insulating layer and insulated from the substrate.

12. The semiconductor device as claimed in claim 11, wherein the collar insulating layer is a silicon oxide layer.

13. The semiconductor device as claimed in claim 11, wherein the first conductive layer is a polysilicon layer.

14. The semiconductor device claimed in claim 11, wherein the second conductive layer is a doped polysilicon layer.

15. The semiconductor device claimed in claim 11, wherein the reverse T-shaped insulating layer is a tetraethyl orthosilicate (TEOS) oxide.

* * * * *